(12) United States Patent
Shin

(10) Patent No.: US 7,411,842 B2
(45) Date of Patent: Aug. 12, 2008

(54) DATA ARRANGEMENT CONTROL SIGNAL GENERATOR FOR USE IN SEMICONDUCTOR MEMORY DEVICE

(75) Inventor: Beom-Ju Shin, Ichon-shi (KR)

(73) Assignee: Hynix Semiconductor, Inc., Kyoungki-Do (KR)

( * ) Notice: Subject to any disclaimer, the term of this patent is extended or adjusted under 35 U.S.C. 154(b) by 107 days.

(21) Appl. No.: 11/024,458

(22) Filed: Dec. 30, 2004

(65) Prior Publication Data

US 2006/0092722 A1    May 4, 2006

(30) Foreign Application Priority Data

Oct. 29, 2004   (KR) ...................... 10-2004-0087324

(51) Int. Cl.
*G11C 7/00* (2006.01)
(52) U.S. Cl. .................. 365/191; 365/193; 365/194; 365/233.1
(58) Field of Classification Search ............... 365/193, 365/191
See application file for complete search history.

(56) References Cited

U.S. PATENT DOCUMENTS

| 5,883,855 | A | | 3/1999 | Fujita |
| 6,166,970 | A | * | 12/2000 | Yun .......................... 365/191 |
| 6,205,062 | B1 | * | 3/2001 | Kim et al. .................. 365/193 |
| 6,453,381 | B1 | | 9/2002 | Yuan et al. |
| 6,687,181 | B2 | | 2/2004 | Usuki et al. |
| 2002/0196662 | A1 | | 12/2002 | Pascucci |

FOREIGN PATENT DOCUMENTS

| KR | 2000-0044591 A | 7/2000 |
| KR | 2001-0048248 A | 6/2001 |
| KR | 2003-0080313 A | 10/2003 |

* cited by examiner

*Primary Examiner*—Hoai V. Ho
*Assistant Examiner*—Kretelia Graham
(74) *Attorney, Agent, or Firm*—McDermott Will & Emery LLP

(57) ABSTRACT

A data arrangement control signal generation circuit for use in a semiconductor memory device includes a plurality of data arrangement control signal generation units connected in series, each for selectively generating a data arrangement control signal according to a column address strobe (CAS) latency.

21 Claims, 7 Drawing Sheets

DATA ARRANGEMENT CONTROL SIGNAL GENERATOR FOR USE IN SEMICONDUCTOR MEMORY DEVICE

This application claims priority from Korean Patent Application No. 10-2004-0087324, filed Oct. 29, 2004.

FIELD OF INVENTION

The present invention relates to a semiconductor memory device; and, more particularly, to a semiconductor memory device for reducing power consumption.

DESCRIPTION OF PRIOR ART

In prior art, a semiconductor memory device employs 2-bit pre-fetch scheme; but 4-bit pre-fetch scheme is considered. Here, the 2-bit pre-fetch is to read two data with one read command through two different buses at a time and output the two data at a rising edge and a falling edge of a clock, respectively.

FIG. 1 is a block diagram showing a pipe latch in a semiconductor memory device in prior art.

The exemplified semiconductor memory device that performs the conventional 4-bit pre-fetch loads 4 serial data inputs on 4 global input/output lines (GIO) with one read command. That is, a data corresponding to a first address is loaded on an even global input/output line GIO_EV0, a data corresponding to a second address is loaded on an odd global input/output line GIO_OD0, a data corresponding to a third address is loaded on an even global input/output line GIO_EV1, and a data corresponding to a fourth address address 3 is loaded on an odd global input/output line GIO_0D1. Here, rdo/fdo are data output lines for outputting data corresponding to the rising edge and falling edge.

The pipe latch 120 in the conventional semiconductor memory device includes 4 pipe latches, and receives data that is carried on an output line Mxoutb of an external multiplexer 110 when a pipe latch-in signal PIN<0:3> becomes a logic low level "L", which controls whether data applied to the pipe latch 120 will be received or not.

FIG. 2 is a block diagram showing input system of signals that are required for arrangement in a pipe latch shown in FIG. 1.

That is, through the pipe latch, the data that is loaded on the output line Mxoutb of the multiplexer 110 passes through 4 times of arrangement. At the first step, that data is loaded on one of the 4 pipe latches depending on the pipe latch-in signal PIN<0:3>, then arranged depending on a data arrangement control signal isoseb0_d0 at the second step, and then arranged depending on an odd data control signal isoseb1_rd for arranging odd data in response to a start address and an even data control signal isoseb1_fd for arranging even data in response to the start address at the third step. At the fourth step, data that is stored at the pipe latch is loaded on the rising edge output line rdo and the falling edge output line fdo depending on an output control signal fpout, fpout for outputting data that is stored at the pipe latches.

Here, the data arrangement control signal isoseb0_do is a control signal for arranging the data that is applied to the pipe latch 121 on the output line of the multiplexer 110 based on whether the start address is odd or even.

On the other hand, when data is read, in order to make the period from the read command to data output being different depending on user request, the data arrangement control signal soseb needs to contain CAS latency information. For this end, there are generated all kinds of data arrangement control signals for supporting a DDR SDRAM in prior art. That is, in prior art, as shown as the timing diagram for data arrangement control signal generation in FIG. 3, all kinds of data arrangement control signals such as soseb00, soseb05, soseb10, soseb15, soseb20, soseb25, soseb30 are generated.

FIG. 4 is a circuit diagram for data arrangement control signal generation in prior art.

The data arrangement control signal generating circuit in prior art generates the data arrangement control signal soseb00 by logically combining a CASP (Column Address Strobe Pulse) signal (CAS Pulse that is a pulse signal enabled at the instance when a read or write command is applied) and an address signal ADD0. Further, the data arrangement control signals soseb05, soseb10, soseb15, soseb20, soseb25, soseb30 are generated, by subsequently delaying the data arrangement control signal soseb00 using alternately a rising clock and a falling clock from a delay locked loop (DLL) clock.

The following Table 1 shows correspondence between the CLs and the data arrangement control signals.

TABLE 1

| CL (CAS Latency) | soseb |
|---|---|
| 1.5 | soseb05 |
| 2.0 | soseb10 |
| 2.5 | soseb15 |
| 3.0 | soseb20 |
| 3.5 | soseb25 |
| 4.0 | soseb30 |

With a circuit for selecting a data arrangement control signal as shown in FIG. 5, all the data arrangement control signals generated as above are inputted and one data output arrangement control signal corresponding to the set CL is outputted. In other words, the data arrangement control signal that is outputted from the circuit for data arrangement control signal selection is used as the data arrangement control signal isoseb0_do in FIG. 2.

However, for example, when CL is 2, only data arrangement control signals soseb00, soseb05 and soseb10 are needed but the remaining data arrangement control signals are not necessary. As a result, the conventional data arrangement control signal generating circuit unnecessarily consumes current because it generates all kinds of data arrangement control signals.

SUMMARY OF INVENTION

It is, therefore, an object of the present invention to provide a data arrangement control signal generation circuit for generating only the required data arrangement control signals according to a predetermined CAS Latency and a method thereof.

In accordance with an aspect of the present invention, there is provided a data arrangement control signal generation circuit for use in a semiconductor memory device including: a plurality of data arrangement control signal generation units connected in series, each for selectively generating a data arrangement control signal according to a column address strobe (CAS) latency.

In accordance with another aspect of the present invention, there is provided a data arrangement control signal generation method for generating data arrangement control signals that are used for arranging data signals that are inputted to pipe latches in a semiconductor memory device, the method including the steps of: (a) outputting a first data arrangement control signal by logically combining a CASP signal that is enabled with an external read command, and a predetermined address signal; (b) transferring the first data arrangement control signal that is inputted under control of a rising clock that is outputted from a delay locked loop, as a second data arrangement control signal; and (c) controlling transfer of the second data arrangement control signal by using a first CAS latency signal that is generated with set CAS latency information, and the rising clock.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a data arrangement control signal generation circuit in accordance with the present invention will be described in detail referring to the accompanying drawings.

Figure 1:
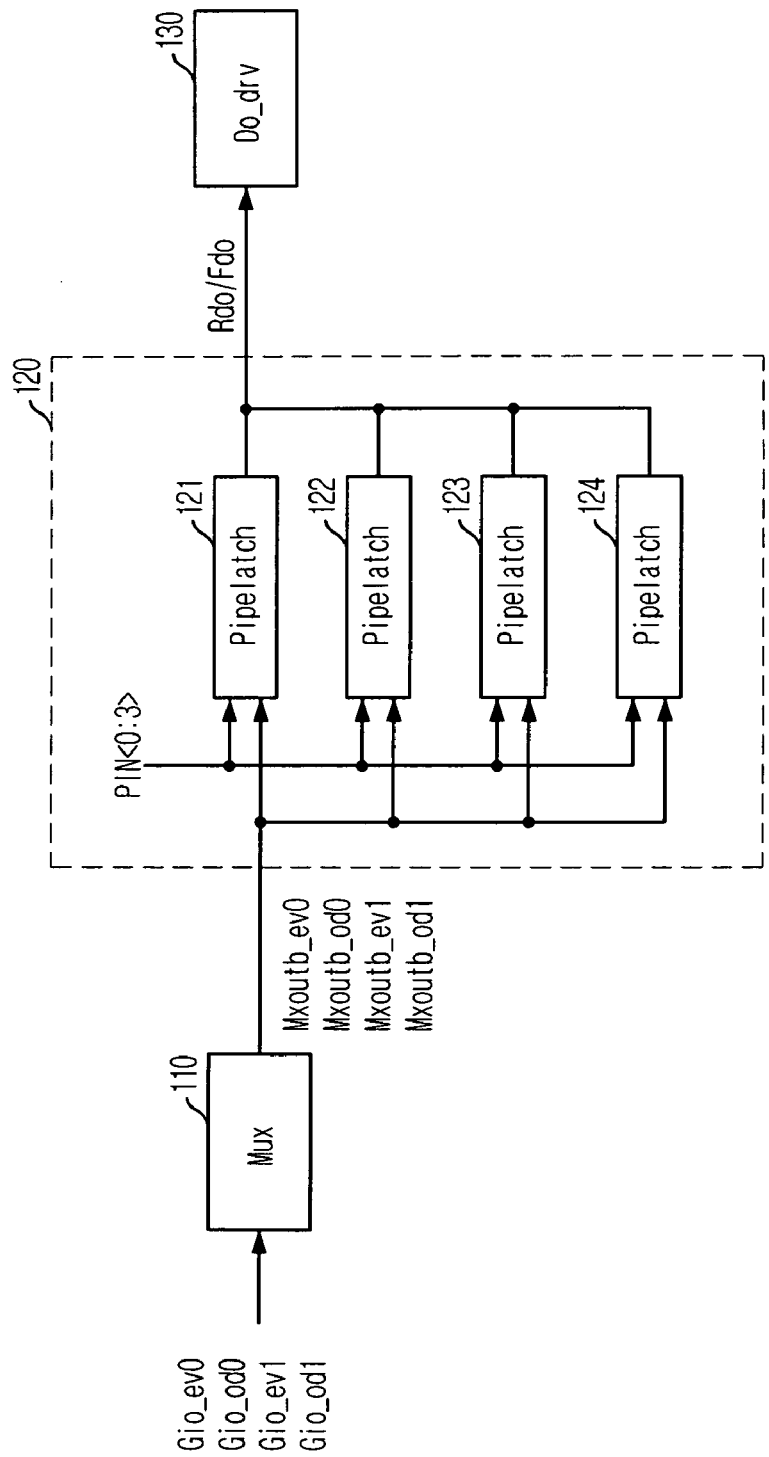
FIG. 1 is a block diagram showing a pipe latch in a semiconductor memory device in prior art.
Figure 2:
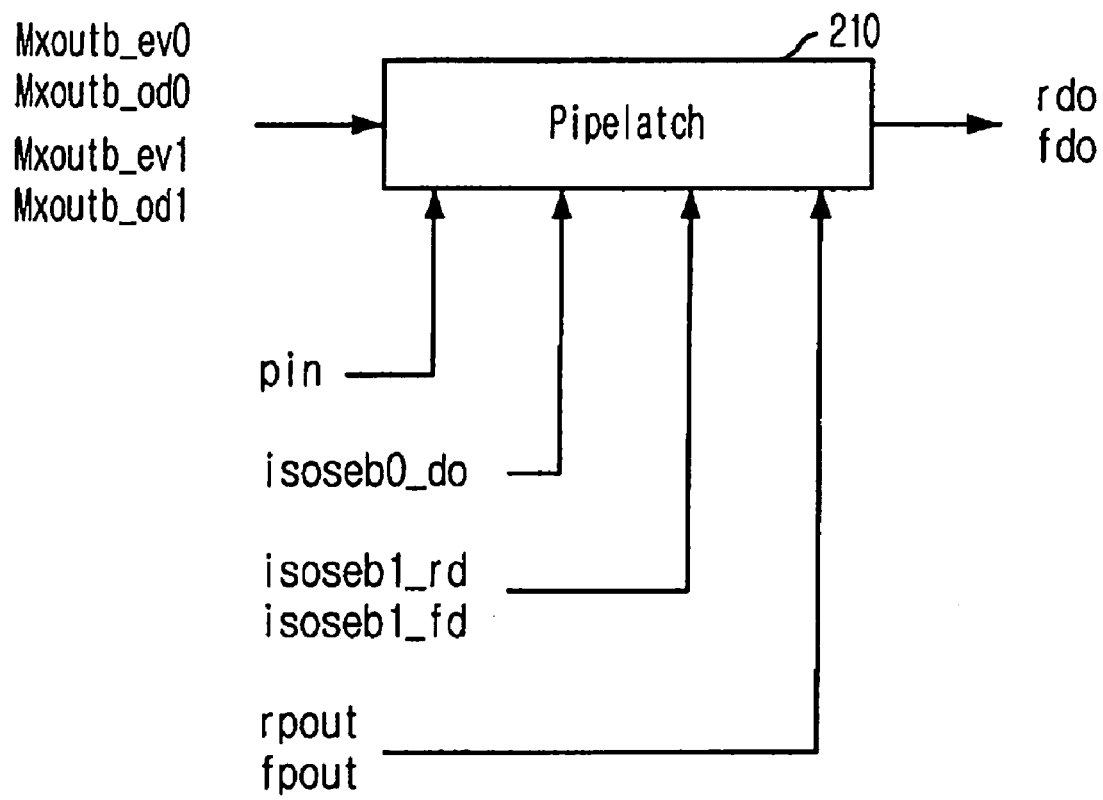
FIG. 2 is a block diagram showing input system of signals that are required for arrangement in a pipe latch shown in FIG. 1.
Figure 3:
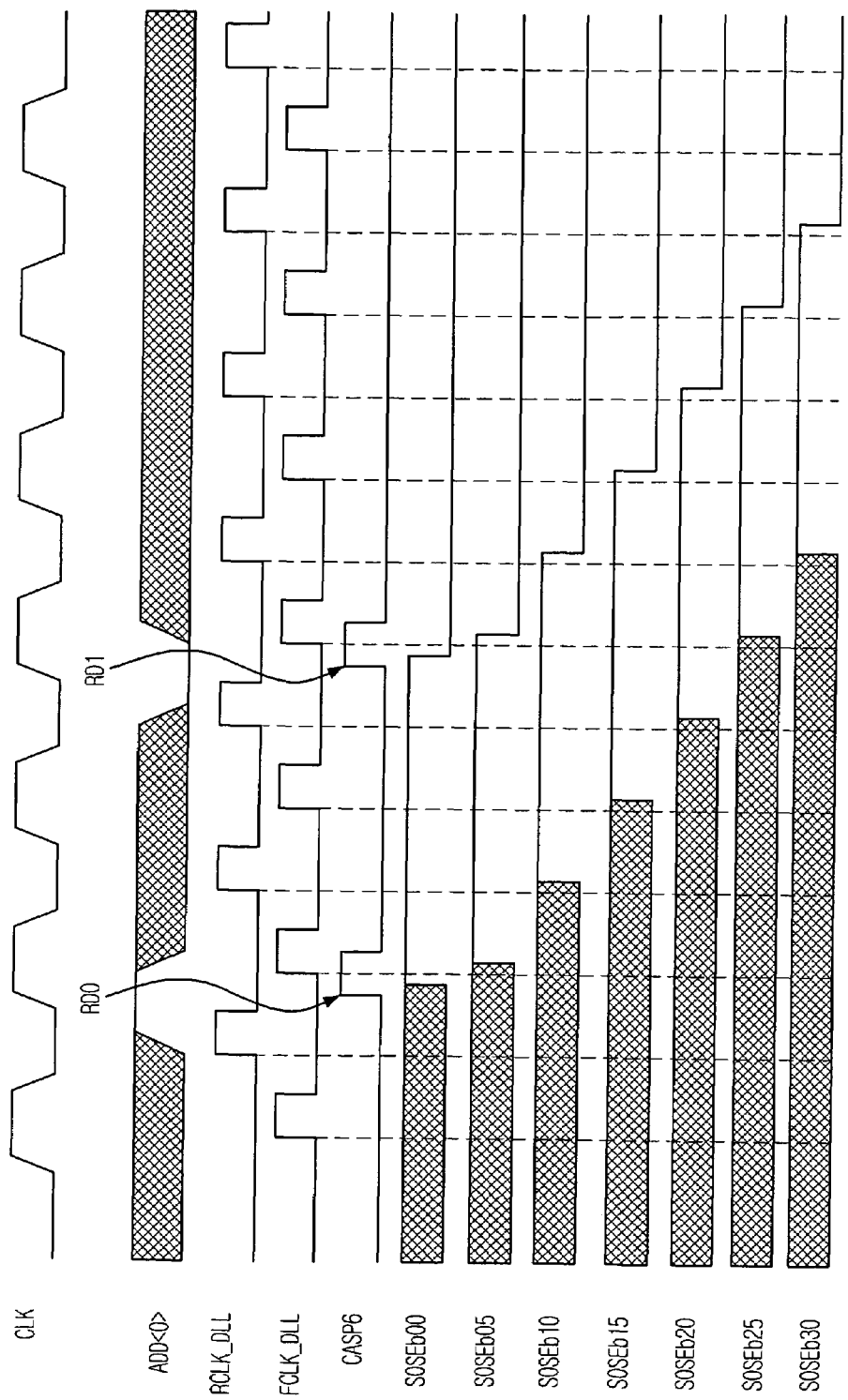
FIG. 3 is a timing diagram for SOSEB signal generation in prior art.
Figure 4:
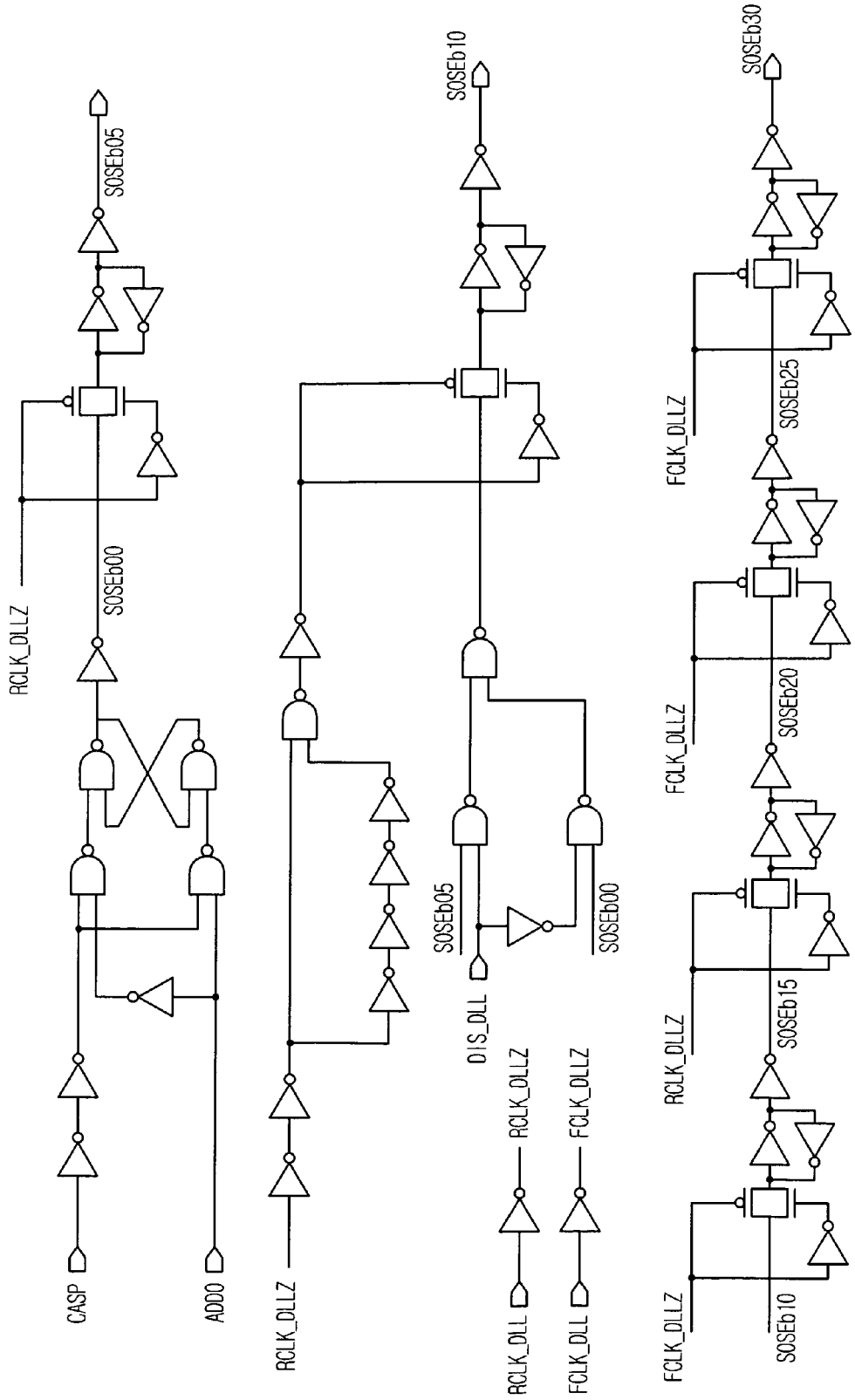
FIG. 4 is a circuit diagram for SOSEB signal generation in prior art.
Figure 5:
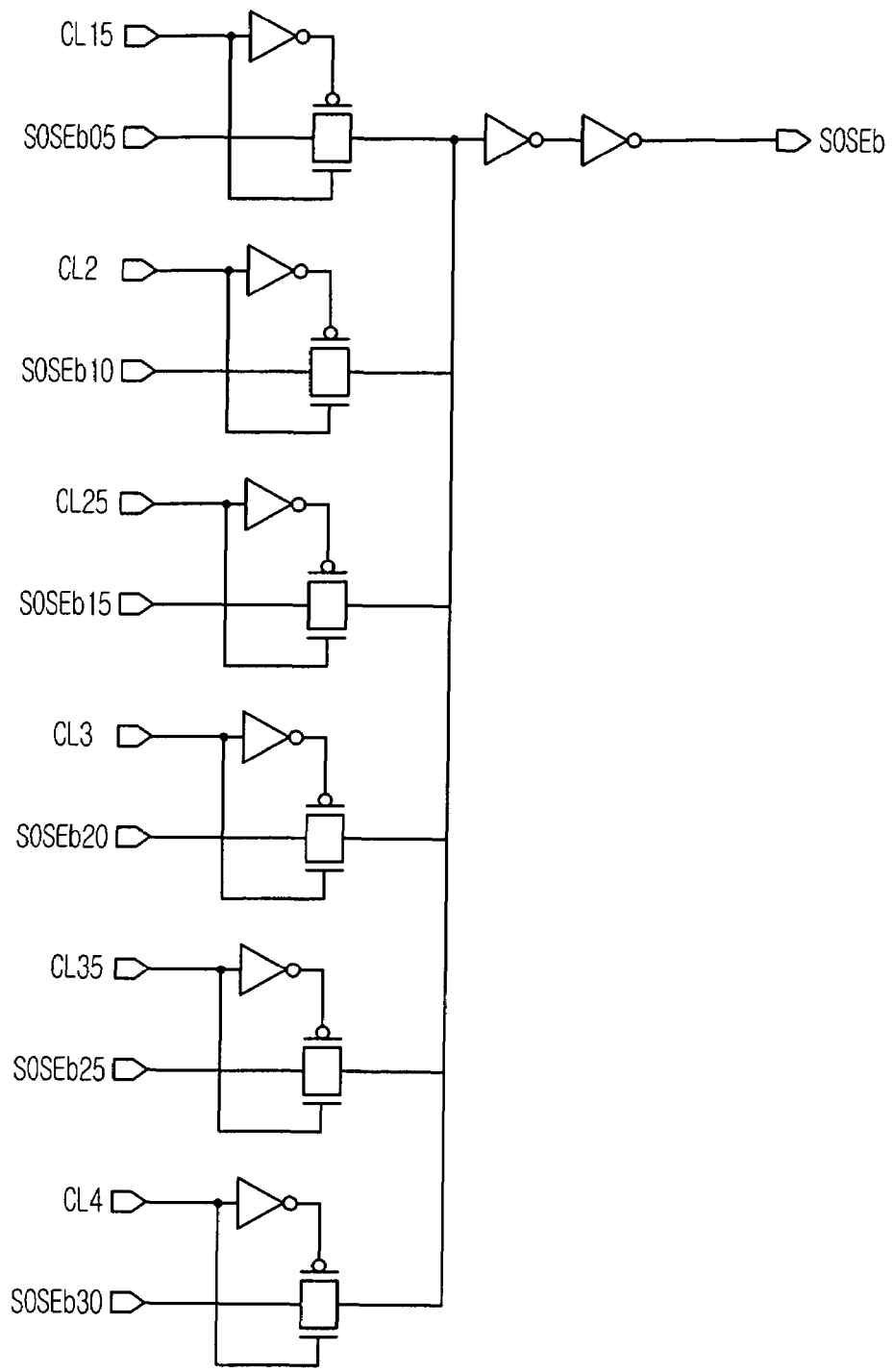
FIG. 5 is a circuit diagram for SOSEB signal selection in prior art.
Figure 6:
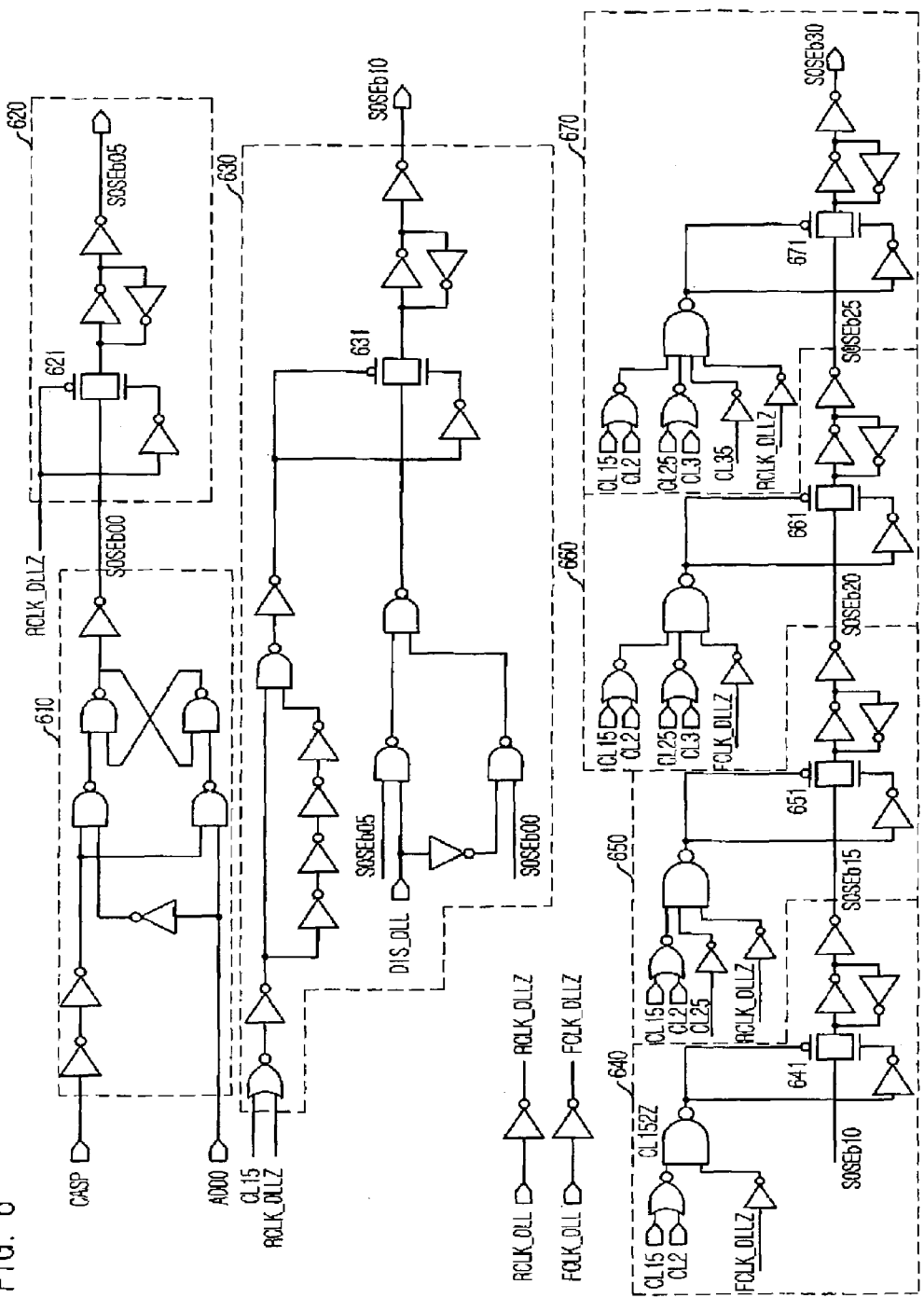
FIG. 6 is a circuit diagram for SOSEB signal generation in accordance with the first embodiment of the present invention.

FIG. 6 is a circuit diagram showing a data arrangement control signal generation circuit in accordance with a first embodiment of the present invention.

According to the first embodiment of the present invention, the data arrangement control signal generation circuit includes a first to a seventh data arrangement control signal generation units 610, 620, 630, 640, 650, 660, and 670, serially coupled, for generating a first to a seventh data arrangement control signals soseb00 to soseb30. Each of the data arrangement control signal generation units 610 to 670 is switched by using CL information to prevent the data arrangement control signal from being unnecessarily generated. Particularly, each data arrangement control signal generation unit uses, as a control signal, a smaller CL than the CL corresponding to the data arrangement control signal that is outputted from the each of the data arrangement control signal generation units 610, 620, 630, 640, 650, 660, and 670.

More particularly, the first data arrangement control signal generation unit 610 outputs a first data arrangement control signal soseb00 by logically combining a CASP signal that is enabled by an external read command, and a predetermined address signal.

The second data arrangement control signal generation unit 620 receives and switches the first data arrangement control signal soseb00 through a first transfer gate 621 that is controlled with a rising clock that is outputted from a delay locked loop (DLL) to output the second data arrangement control signal soseb05.

The third data arrangement control signal generation unit 630 outputs the third data arrangement control signal soseb1O by receiving and switching the second data arrangement control signal sosebO5 and a disable signal DIS DLL through a second transfer gate 631 that is controlled with a CL15 and the rising clock RCLK_DLLZ. That is, when the CL is set as CL=1.5 in the semiconductor memory device, the second transfer gate 631 is turned off by the CL15 so that the third data arrangement control signal generation unit 630 does not output the third data arrangement control signal soseb1O.

The fourth data arrangement control signal generation unit 640 receives and switches the third data arrangement control signal soseb10 through a third transfer gate 641 that is controlled with the CL15, CL2 and a falling clock FCLK_DLLZ to output the fourth data arrangement control signal soseb15. That is, when the CL is set as CL=2.0 in the semiconductor memory device, the third transfer gate 641 is turned off by the CL152Z for a logic NOR operations to be performed to the CL15 and the CL2 so that the fourth data arrangement control signal generating unit 640 does not output the fourth data arrangement control signal soseb15.

The fifth data arrangement control signal generation unit 650 receives and switches the fourth data arrangement control signal soseb15 through a fourth transfer gate 651 that is controlled with the CL15, CL2, CL25 and the rising clock RCLK_DLLZ to output the fifth data arrangement control signal soseb20.

The sixth data arrangement control signal generation unit 660 receives and switches the fifth data arrangement control signal soseb20 through a fifth transfer gate 661 that is controlled with the CL15, CL2, CL25, CL3 and the falling clock FCLK_DLLZ to output the sixth data arrangement control signal soseb25.

The seventh data arrangement control signal generation unit 670 receives and switches the sixth data arrangement control signal soseb25 through a sixth transfer gate 671 that is controlled with the CL15, CL2, CL25, CL3, CL35 and the falling clock RCLK_DLLZ.

According to the operation as described above, only the data arrangement control signals that are required can be generated by using the CLs that are set in a mode register set (MRS) in the semiconductor memory device. For example, when CL=3, the first to fifth data arrangement control signals are used while the sixth and seventh signals are not used. Accordingly, there's no need to generate the sixth and seventh data arrangement control signals.

Figure 7:
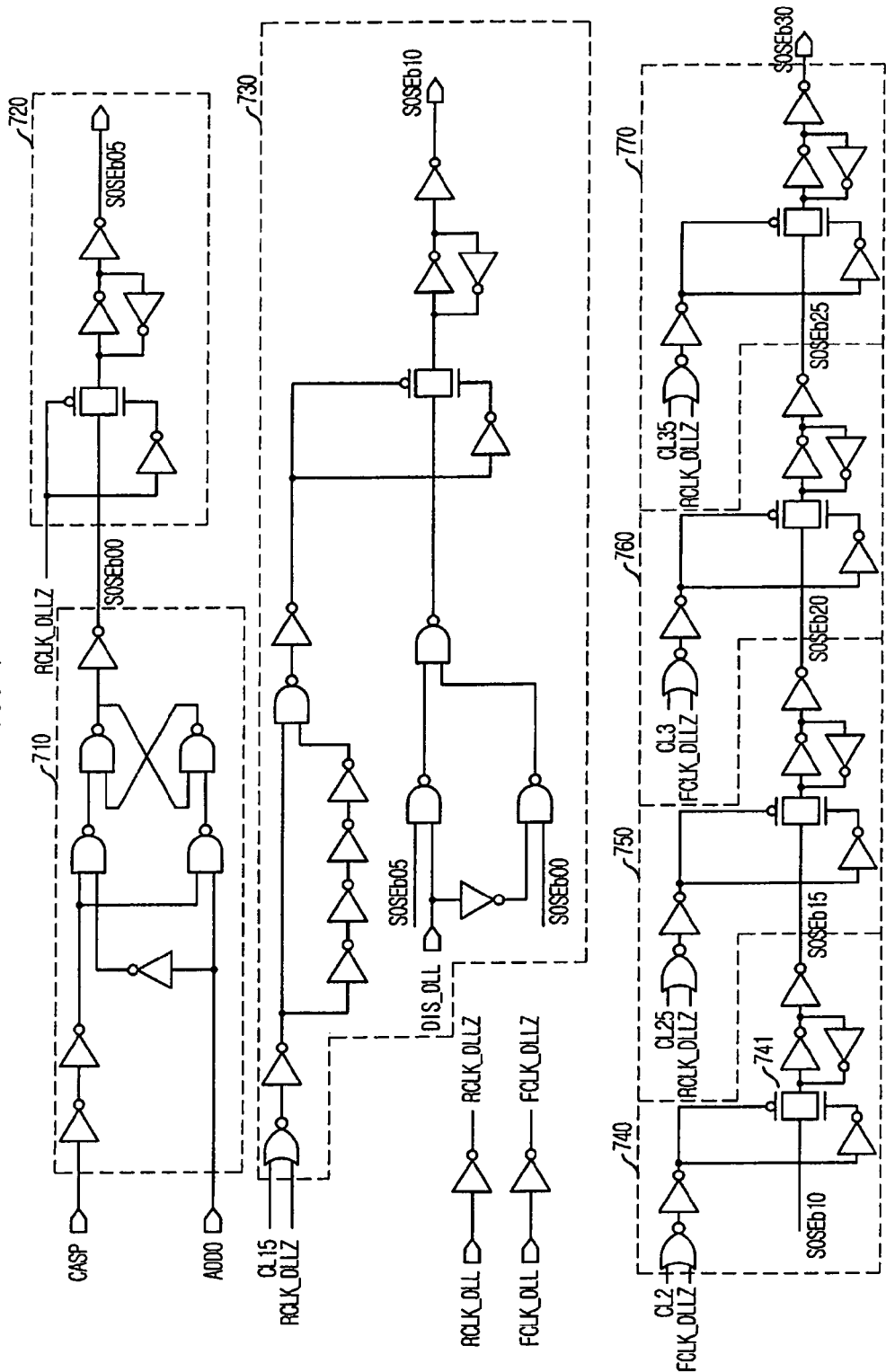
FIG. 7 is a circuit diagram for SOSEB signal generation in accordance with the second embodiment of the present invention.

FIG. 7 is a circuit diagram showing a data arrangement control signal generation circuit in accordance with a second embodiment of the present invention, which is similar to the first embodiment as shown in FIG. 6 except that generation of the control signals that are applied to the respective transfer gates that are included in the fourth to seventh data arrangement control signal generating units.

For example, the fourth data arrangement control signal generation unit 740 receives and switches the third data arrangement control signal soseb10 through a third transfer gate 741 that is controlled with the CL2 and the falling clock FCLK_DLLZ to output the fourth data arrangement control signal soseb15. That is, when the CL is set as CL=2.0 in the semiconductor memory device, the third transfer gate 741 is turned off by the CL2 so that the fourth data arrangement control signal generation unit 740 does not generate the fourth data arrangement control signal soseb15. At this point, the transfer gates in the fifth to seventh data arrangement control signal generation units are turned on under control of the clock that is outputted from the DLL but outputs only the previously inputted signal because the third data arrangement control signal soseb10 is not transferred since the third transfer gate 741 is turned off.

As described above, the present invention can prevent or reduce unnecessary current consumption by generating only the data arrangement control signals required when data is read.

The present application contains subject matter related to Korean patent application No. 2004-87324, filed in the Korean Patent Office on Oct. 29, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data arrangement control signal generation circuit for use in a semiconductor memory device, comprising:
   a plurality of data arrangement control signal generation units connected in series for selectively generating a data arrangement control signal according to a CAS pulse (CASP) signal or a CAS Latency signal based on column address strobe (CAS) latency information and an output of a delay locked loop (DLL),
   wherein a first data arrangement control signal generation unit logically combines the CASP signal enabled based on an external read command and a predetermined address to output a first data arrangement control signal;
   a second data arrangement control signal generation unit transfers the first data arrangement control signal in response to a rising clock that is outputted from the DLL to output a second data arrangement control signal; and
   a third data arrangement control signal generation unit selectively transfers the first or second data arrangement control signal in response to a first CAS latency signal and the rising clock, the first CAS latency signal having a first CAS latency information including a first CAS latency value to output a third data arrangement control signal; and
   a fourth data arrangement control signal generation unit selectively transfers the third data arrangement control signal in response to the first CAS latency signal, a second CAS latency signal and a falling clock that is outputted from the DLL, the second CAS latency signal having a second CAS latency information including a second CAS latency value to output a fourth data arrangement control signal.

2. The data arrangement control signal generation circuit as recited in claim 1, wherein the plurality of data arrangement control signal generation units further includes a fifth data arrangement control signal generation unit for selectively transferring the fourth data arrangement control signal according to the first CAS latency signal, the second CAS latency signal, a third CAS latency signal and the rising clock, the third CAS latency signal having a third CAS latency information including a fourth CAS latency value to output a fifth data arrangement control signal.

3. The data arrangement control signal generation circuit as recited in claim 2, wherein the plurality of data arrangement control signal generation units further includes a sixth data arrangement control signal generation unit for selectively transferring the fifth data arrangement control signal according to the first CAS latency signal, the second CAS latency signal, the third CAS latency signal, a fourth CAS latency signal and the falling clock, the fourth CAS latency signal having a fourth CAS latency information including a fourth CAS latency value to output a sixth data arrangement control signal.

4. The data arrangement control signal generation circuit as recited in claim 3, wherein the plurality of data arrangement control signal generation units further includes a seventh data arrangement control signal generation unit for selectively transferring the sixth data arrangement control signal according to the first CAS latency signal, the second CAS latency signal, the third CAS latency signal, the fourth CAS latency signal, a fifth CAS latency signal and the rising clock, the fifth CAS latency signal having a fifth CAS latency information including a fifth CAS latency value to output a seven data arrangement control signal.

5. The data arrangement control signal generation circuit as recited in claim 1, wherein the third data arrangement control signal generation unit includes:
   a first NOR gate for receiving the first CAS latency signal and the inverted version of the rising clock;
   a delay for delaying an output of the NOR gate;
   a first inverter for inverting an output of the delay;
   a first NAND gate for receiving a disable signal, indicating that the delay locked loop is disabled, and the second data arrangement control signal;
   a second NAND gate for receiving an inverted version of the disable signal and the first data arrangement control signal;
   a third NAND gate for receiving an output of the first and second NAND gates; and
   a second transfer gate for switching an output of the third NAND gate under control of an output of the first inverter.

6. The data arrangement control signal generation circuit as recited in claim 2, wherein the fourth data arrangement control signal generation unit includes:
   a NOR gate for receiving the first and the second CAS latency signals;
   a NAND gate for receiving an output of the NOR gate and the falling clock; and
   a third transfer gate for switching the third data arrangement control signal under control of an output of the NAND gate.

7. The data arrangement control signal generation circuit as recited in claim 2, wherein the fifth data arrangement control signal generation unit includes:
   a NOR gate for receiving the first and the second CAS latency signals;
   a NAND gate for receiving an output of the NOR gate, an inverted version of the third CAS latency signal and the rising clock; and
   a fourth transfer gate for switching the fourth data arrangement control signal under control of an output of the NAND gate.

8. The data arrangement control signal generation circuit as recited in claim 3, wherein the sixth data arrangement control signal generation unit includes:
   a first NOR gate for receiving the first and the second CAS latency signals;
   a second NOR gate for receiving the third and the fourth CAS latency signals;
   a NAND gate for receiving an output of the first NOR gate, an output of the second NOR gate and the falling clock; and
   a fifth transfer gate for switching the fifth data arrangement control signal under control of an output of the NAND gate.

9. The data arrangement control signal generation circuit as recited in claim 4, wherein the seventh data arrangement control signal generation unit includes:
- a first NOR gate for receiving the first and the second CAS latency signals;
- a second NOR gate for receiving the third and the fourth CAS latency signals;
- a NAND gate for receiving outputs of the first and the second NOR gates, an inverted version of the fifth CAS latency signal and the rising clock; and
- a sixth transfer gate for switching the sixth data arrangement control signal under control of an output of the NAND gate.

10. The data arrangement control signal generation circuit as recited in claim 1, wherein the plurality of data arrangement control signal generation units further includes:
- a fifth data arrangement control signal generation unit for transferring the fourth data arrangement control signal according to a third CAS latency signal and the rising clock, the third CAS latency signal being generated with the CAS latency information to output a fifth data arrangement control signal.

11. The data arrangement control signal generation circuit as recited in claim 10, wherein the plurality of data arrangement control signal generation units further includes:
- a sixth data arrangement control signal generation unit for transferring the fifth data arrangement control signal according to a fourth CAS latency signal and the falling clock, the fourth CAS latency signal being generated with the CAS latency information to output a sixth data arrangement control signal.

12. The data arrangement control signal generation circuit as recited in claim 11, wherein the plurality of data arrangement control signal generation units further includes:
- a seventh data arrangement control signal generation unit for transferring the sixth data arrangement control signal according to a fifth CAS latency signal and the rising clock, the fifth CAS latency signal being generated with the CAS latency information to output a seventh data arrangement control signal.

13. The data arrangement control signal generation circuit as recited in claim 1, wherein the fourth data arrangement control signal generation unit includes:
- a NAND gate for receiving the second CAS latency signal and an inverted version of the falling clock outputted from the DLL;
- an inverter for inverting an output of the NAND gate; and
- a third transfer gate for switching the third data arrangement control signal under control of an output of the inverter.

14. The data arrangement control signal generation circuit as recited in claim 10, wherein the fifth data arrangement control signal generation unit includes:
- a NAND gate for receiving the third CAS latency signal and an inverted version of the rising clock that is outputted from the delay locked loop;
- an inverter for inverting an output of the NAND gate; and
- a fourth transfer gate for switching the fourth data arrangement control signal under control of an output of the inverter.

15. The data arrangement control signal generation circuit as recited in claim 11, wherein the sixth data arrangement control signal generation unit includes:
- a NAND gate for receiving the fourth CAS latency signal and an inverted version of the falling clock;
- an inverter for inverting an output of the NAND gate; and
- a fifth transfer gate for switching the fifth data arrangement control signal under control of an output of the inverter.

16. The data arrangement control signal generation circuit as recited in claim 12, wherein the seventh data arrangement control signal generation unit includes:
- a NAND gate for receiving the fifth CAS latency signal and an inverted version of the rising clock;
- an inverter for inverting an output of the NAND gate; and
- a sixth transfer gate for switching the sixth data arrangement control signal under control of an output of the inverter.

17. A method for arranging data signals, the method comprising:
- outputting a first data arrangement control signal by logically combining a CASP signal that is enabled with an external read command, and a predetermined address signal;
- transferring the first data arrangement control signal that is inputted under control of a rising clock that is outputted from a delay locked loop, as a second data arrangement control signal;
- selectively transferring the second data arrangement control signal in response to a first CAS latency signal having a first CAS latency information, and the rising clock to output a third data arrangement control signal; and
- selectively transferring the third data arrangement control signal in response to the first CAS latency signal, a second CAS latency signal having a second CAS latency information, and a falling clock that is outputted from the delay locked loop.

18. A data arrangement control signal generation circuit for use in a semiconductor memory device, comprising:
- a first data arrangement control signal generation unit for generating a first data arrangement control signal in response to a CAS pulse (CASP) signal and a DLL clock that is outputted from a delay locked loop (DLL); and
- a second data arrangement control signal generation unit for selectively generating a second data arrangement control signal in response to a first CAS Latency signal and the DLL clock
- wherein the first CAS Latency signal has a first CAS latency information corresponding to a first CAS latency value.

19. The data arrangement control signal generation circuit of claim 18 further comprising a third data arrangement control signal generation unit for selectively generating a third data arrangement control signal in response to a second CAS Latency signal and the DLL clock;
- wherein the second CAS Latency signal has a second CAS latency information corresponding to a second CAS latency value.

20. The data arrangement control signal generation circuit of claim 18, the first CAS latency value includes 1.5 and 2.0.

21. The data arrangement control signal generation circuit of claim 19.the second CAS latency value includes 1.5, 2.0 and 2.5.

* * * * *